United States Patent [19]
Reif et al.

[11] Patent Number: 4,668,530
[45] Date of Patent: May 26, 1987

[54] LOW PRESSURE CHEMICAL VAPOR DEPOSITION OF REFRACTORY METAL SILICIDES

[75] Inventors: L. Rafael Reif, Newton; Prabha K. Tedrow, Lexington; Vida Ilderem, Watertown, all of Mass.

[73] Assignee: Massachusetts Institute of Technology, Cambridge, Mass.

[21] Appl. No.: 758,146

[22] Filed: Jul. 23, 1985

[51] Int. Cl.$^4$ .............................................. B05D 3/06
[52] U.S. Cl. ...................................... 427/55; 427/93; 427/95; 427/99; 427/255; 427/255.2; 427/255.7; 427/419.7
[58] Field of Search ................ 427/93, 95, 99, 255.2, 427/255, 255.7, 419.7, 55, 314, 372.2

[56] References Cited

U.S. PATENT DOCUMENTS

| | | | |
|---|---|---|---|
| 3,661,637 | 5/1972 | Sirtl | 427/55 |
| 4,180,596 | 12/1979 | Crowder et al. | 427/255.2 |
| 4,359,490 | 11/1982 | Lehrer | 427/255.2 |
| 4,391,846 | 7/1983 | Raymond | 427/255.2 |
| 4,496,609 | 1/1985 | McNeilly et al. | 427/55 |
| 4,504,521 | 3/1985 | Widmer et al. | 427/255.2 |
| 4,557,943 | 12/1985 | Rosler et al. | 427/255.2 |
| 4,568,565 | 2/1986 | Gupta et al. | 427/255.2 |

OTHER PUBLICATIONS

Doo, "Coated Graphite Susceptor", IBM Technical Disclosure Bulletin, vol. 9, No. 11, Apr. 1967.
Article entitled, "Plasma-Enhanced CVD of Titanium Silicide", J. Vac. Sci. Technol., B 2 (4), Oct.-Dec. 1984, pp. 733-737.
Abstract No. 377, from Extended Abstracts, vol. 84-2, Fall Meeting Electrochemical Society, New Orleans, Oct. 7, 1984.

Primary Examiner—Sadie L. Childs
Attorney, Agent, or Firm—Hamilton, Brook, Smith & Reynolds

[57] ABSTRACT

This invention relates to a process and apparatus for the Low Pressure Chemical Vapor Deposition (LPCVD) of polycrystalline refractory metal silicides, such as TiSi$_2$, in a reactor. An oxidized Si wafer is loaded in the reactor. The reactor is pumped down to a pressure of about 10$^{-7}$ Torr, or less. The Si substrate is heated to the predetermined deposition temperature of about 630° C. while avoiding heating of the reactor walls. The reactor is then purged with an inert gas, such as nitrogen. Next, polysilicon is deposited on the wafer by introducing SiH$_4$ into the reactor at a pressure in the order of 0.2 Torr. A layer of polycrystalline titanium silicide is then formed on the polysilicon layer by introducing reactants, such as TiCl$_4$ and SiH$_4$, into the reactor at depositon temperatures between about 650° to 700° C. and pressures of between about 50 to 460 m Torr.

6 Claims, 4 Drawing Figures

LOW PRESSURE CHEMICAL VAPOR DEPOSITION OF REFRACTORY METAL SILICIDES

TECHNICAL FIELD

This invention is in the field of semiconductors and more specifically formation of polycrystalline titanium silicide films on substrates.

BACKGROUND ART

Because of its excellent material properties polysilicon is the chief material used in the formation of integrated circuits.

In order to take advantage of the emerging technology of faster and smaller integrated circuit devices, it is necessary to develop new materials which can be used as interconnection and gate materials instead of, or in conjunction with, polysilicon. These materials must have lower resistivity than polysilicon and should be compatible with current integrated circuit processes. Silicides of refractory metals (Mo, W, Ti and Ta) with their metallic conductivity and high temperature stability, meet these requirements.

Refractory metal silicides are most commonly prepared by some form of Physical Vapor Deposition (PVD) process, such as, sputtering or co-evaporation. However, Chemical Vapor Deposition (CVD) with its advantages of good conformal coverage, high throughput and purity promises to be a much better method of depositing refractory metal silicide films.

A particularly excellent candidate metal silicide material is $TiSi_2$ because of its lower resistivity compared to other refractory metal silicides.

To our knowledge, attempts by others to devise a satisfactory CVD process for depositing polycrystalline films of $TiSi_2$ have been unsuccessful.

DISCLOSURE OF THE INVENTION

This invention relates to a process and apparatus for the Low Pressure Chemical Vapor Deposition (LPCVD) of polycrystalline refractory (stable at high temperatures) metal silicides, preferably $TiSi_2$, in a reactor.

First, the substrate, preferably a cleaned and oxidized Si wafer, is loaded in a reactor. Next, the lines connecting the pump to the reactor chamber are opened to the pump so that pressure in the system is lowered. The Si substrate is heated to the predetermined deposition temperature of about 630° C. while keeping the reactor walls cold. Keeping the walls cold prevents depositions on the walls and out-diffusion of impurities from the walls. Concurrently, the reactor is cyclically purged with an inert gas, such as nitrogen to bring the pressure down to $10^{-7}$ Torr as measured by a capacitance gauge coupled to the reactor chamber. Next, polysilicon is deposited on the wafer by introducing a silicon reactant, $SiH_4$, into the reactor while maintaining a pressure on the order of $2 \times 10^{-1}$ Torr. A layer of polycrystalline titanium silicide is then formed on the polysilicon layer by introducing silicon atom and titanium atom containing gaseous reactants, such as $TiCl_4$ and $SiH_4$, into the reactor at substrate deposition temperatures between about 650° to 700° C. and chamber pressures of between about 50 to $460 \times 10^{-3}$ Torr.

In-situ sequential deposition of polysilicon and polycrystalline titanium silicide with good surface smoothness, low resistivity and uniform thickness of coating have been obtained, in accordance with the above procedure.

BEST MODE OF CARRYING OUT THE INVENTION

Figure 1:
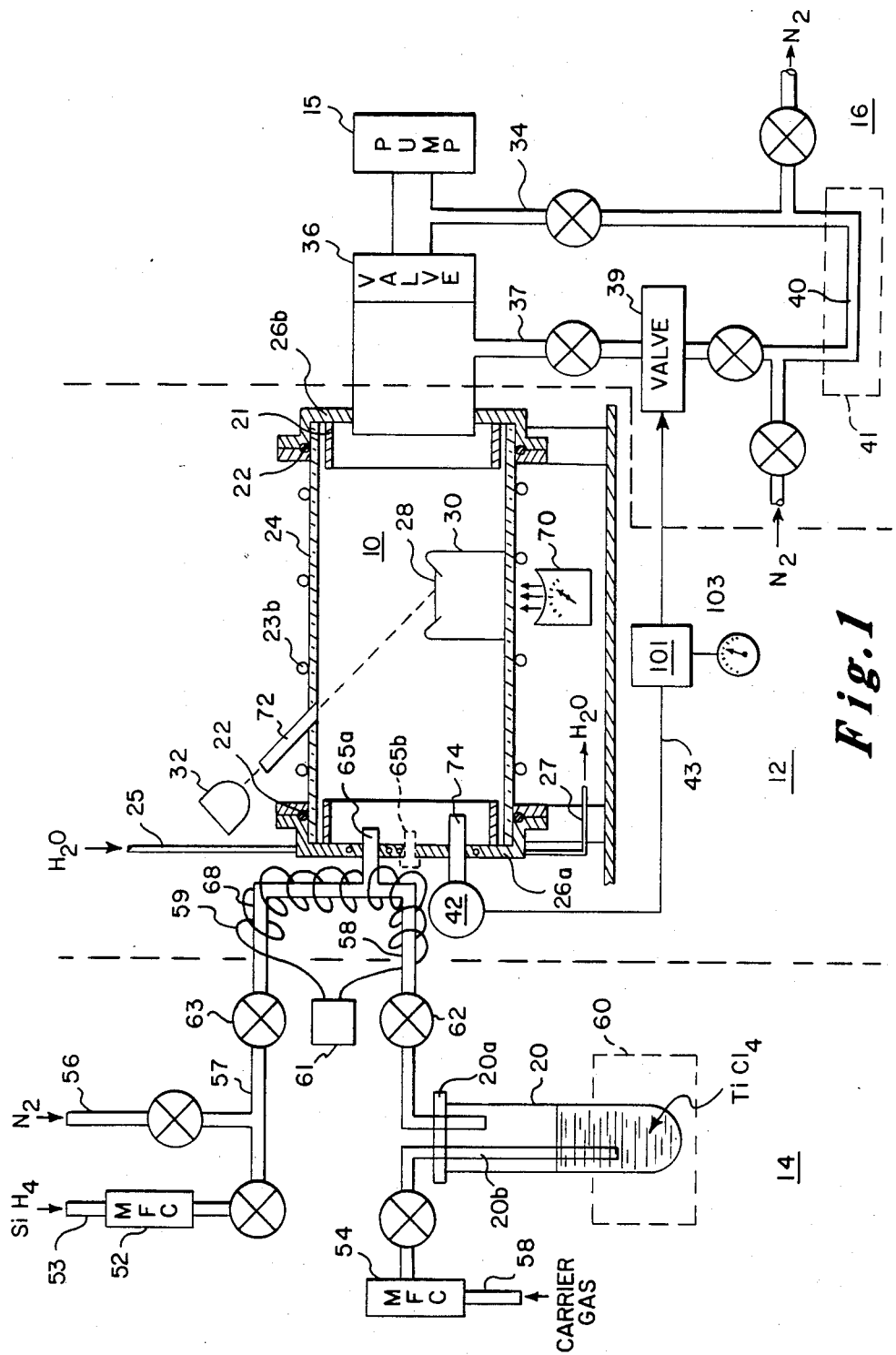
FIG. 1 is a schematic diagram of the reactor system.
Figure 3:
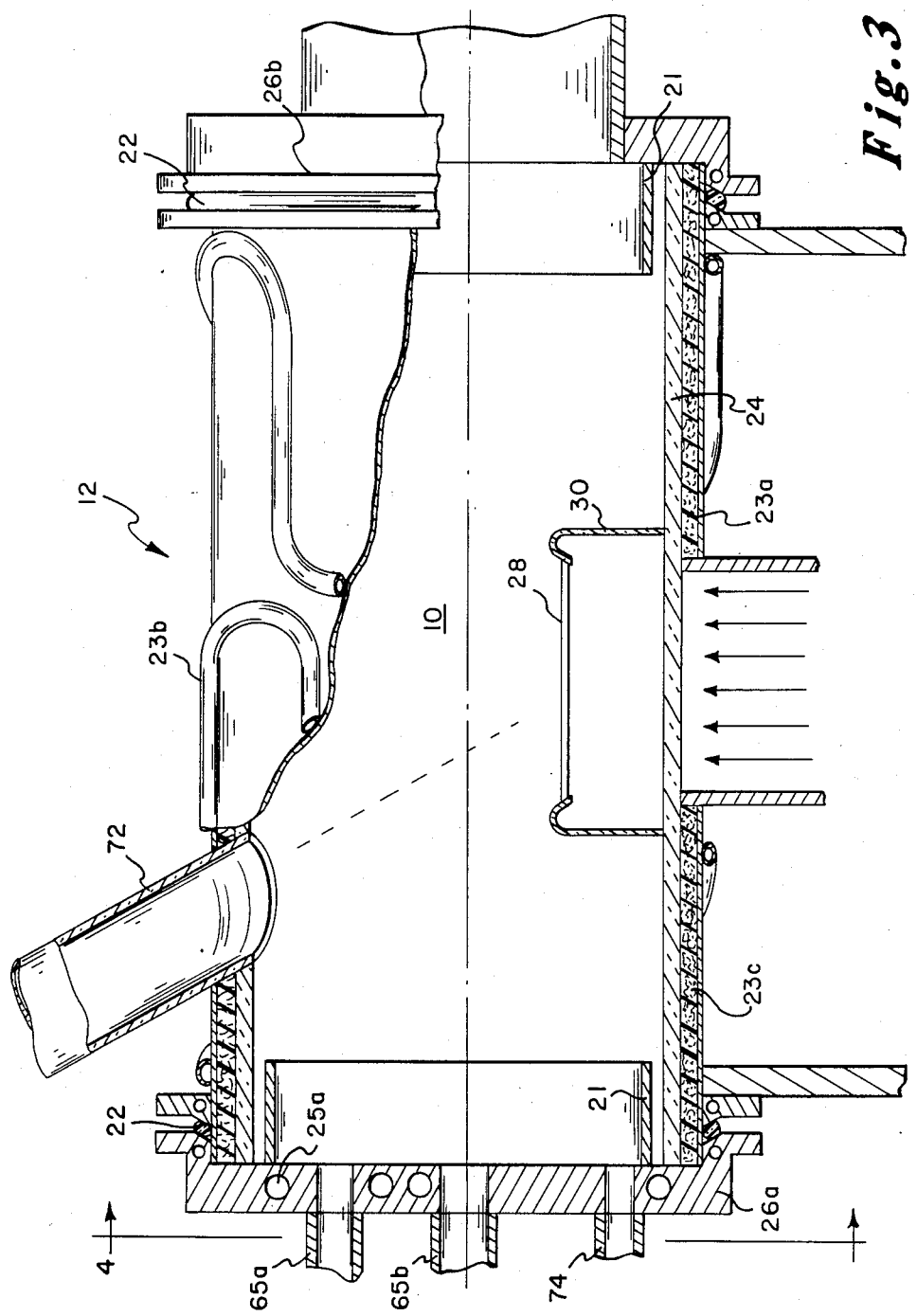
FIG. 3 is a detailed cross-sectional view of the reactor of FIG. 1.
Figure 4:
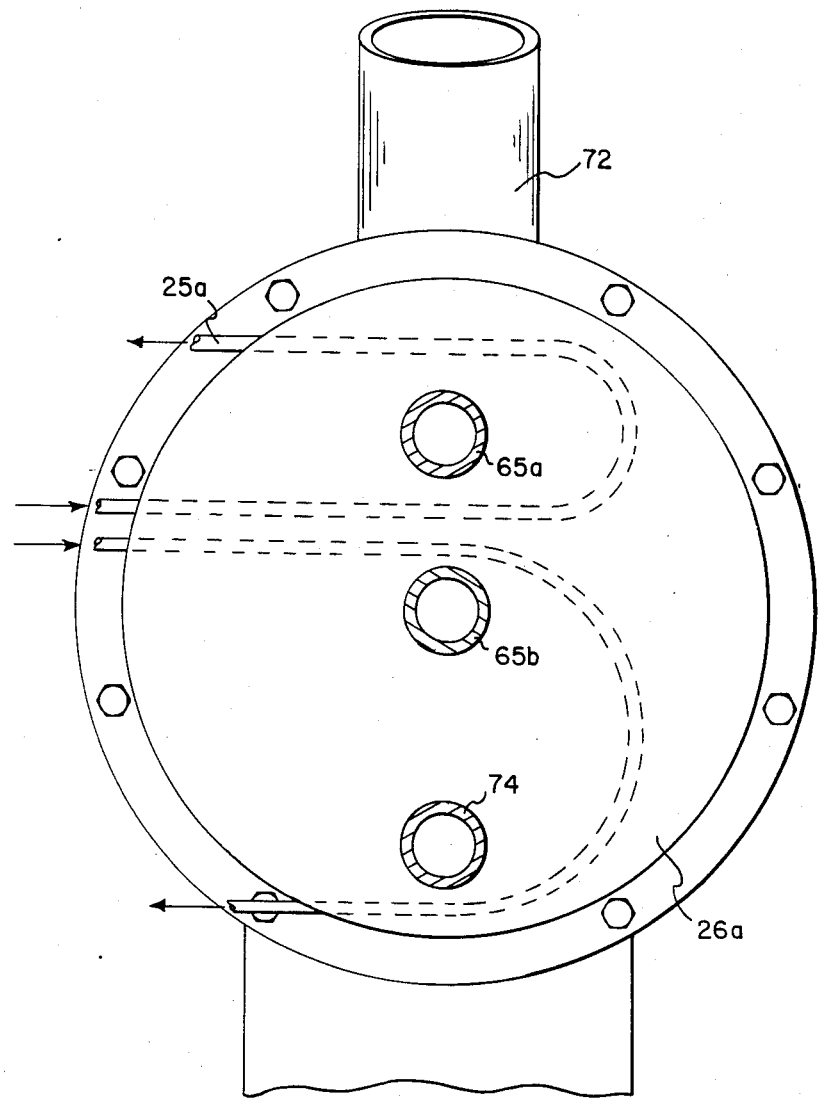
FIG. 4 is an end view taken along lines 4—4 of FIG. 3.

Referring now to FIGS. 1, 3 and 4, a preferred embodiment of the invention will now be described in connection therewith.

The reactor system is a Low Pressure CVD (LPCVD) reactor system for producing metal silicides, such as titanium disilicide ($TiSi_2$) films from reactants containing Si atoms, i.e., silane ($SiH_4$) as a silicon source and metal atoms, i.e., titanium tetrachloride ($TiCl_4$) as a metal source. As previously stated, $TiSi_2$ is a preferred film material because of its lower resistivity compared to other refractory metal silicides. However, the invention is not intended to be limited to production of $TiSi_2$ films., but other refractory metal silicide films, such as $MoSi_2$, $WSi_2$ and $TaSi_2$ are contemplated as well.

The LPCVD reactor system of FIGS. 1, 3 and 4 consists of a gas distribution system 14 a reaction chamber, and heating system 12, and a pumping system 16. Research purity gases (less than 0.1 ppm each of $O_2$, $H_2O$, etc.) from gas reservoirs (not shown), are supplied at the various inlets shown in FIG. 1. The gas flows (except that of $N_2$) are controlled by mass flow controllers 52 and 54. The available gases are silane, nitrogen, argon and hydrogen.

Nitrogen is introduced at line 56 to backfill the chamber 10 after a deposition is completed. $TiCl_4$ is stored in a Pyrex tube 20. The Pyrex tube is sealed at the bottom end while the other end has a stainless steel conflat flange 20a. A bubbler 20b is incorporated in this flange, enabling a carrier gas, such as argon or nitrogen from line 58 to deliver the $TiCl_4$ to the chamber if it is necessary. The Pyrex tube containing the $TiCl_4$ is immersed in a 28° C. temperature bath 60 to keep its temperature and thus its vapor pressure constant. The flow of the $TiCl_4$ vapor to the chamber 10 on line 58 is controlled by needle valve 62.

All the lines from the $TiCl_4$ reservoir to the chamber 10 are heated by a resistance tape 59 connected to an electrical source 61. In this manner, the temperature of the lines is maintained higher than the bath temperature to keep the $TiCl_4$ vapor from condensing in the lines. $SiH_4$ is delivered from inlet 53 through mass flow controller 52 and valve 63. Three port junction 65a is coupled to flange 26a and to the lines from the two needle valves 63 and 62. The $SiH_4$ and $TiCl_4$ can be delivered to the chamber either pre-mixed or separately, as desired. For pre-mixing, three port junction 65a is used as shown. For separate connection, alternate port 65b, shown in dotted lines in FIG. 1, is connected to one of the lines 58 or 68.

The chamber 10 consists of a quartz tube 24 (155 mm OD, 508 mm long) sealed to stainless steel flanges 26a and 26b at each end by Teflon coated Viton gaskets 22. Radiation shields 21 are attached inside flanges 26a and 26b adjacent to gaskets 22 to minimize heat damage to the gasket seals. As shown in detail in FIG. 3, a copper sheet 23a surrounds the chamber 10 to contain the unabsorbed radiation from the IR lamps. The sheet 23a has copper tubing 23b soldered over its surface and a flow of cold water through the tubing keeps the sheet 23a from getting hot. Insulation 23c is provided between copper sheet 23a and quartz tube 24. Cold water is also introduced through inlet port 25 through passageways 25a in flanges 26a and 26b to outlet port 27 to further minimize heat damage to the gaskets. A single wafer 28 sits on a quartz holder 30 and is supported around its periphery. An incoherent radiant heater 70 (6×6 KW infrared lamps) positioned outside and adjacent the chamber 10 directly heats the wafer 28 by radiation from below. The wafer temperature (calibrated using a thermocouple embedded in a dummy wafer and/or by use of melting point standards) is monitored by an infrared pyrometer 32 through a transparent viewing tube 72 in a wall of the reactor.

Note that the apparatus as thus far described is particularly adapted for processing silicon wafers while maintaining the reactor walls cold. The heating of the wafer 28 is accomplished by IR lamps 70 which emit light waves of a frequency which are absorbed by silicon; so that the silicon is appropriately heated. The quartz envelope 24 of the reactor 10 is substantially transparent to the IR radiation and remains cool.

Water cooling is provided so that the copper shield 23a, which absorbs any stray radiation, can be kept cold.

The chamber is pumped on by a 510 l/s turbomolecular pump 15 backed by a 11 CFM chemical resistant mechanical pump (not shown). The system base pressure in the reactor is established at less than or equal to about $10^{-7}$ Torr by pumping out the chamber 10 with pump 15 prior to deposition. A gate valve 36 isolates the chamber 10 from the turbomolecular pump 15. In addition, a line 37 bypassing the gate valve 36 and containing a butterfly pressure controlling valve 39 and a cold trap 40 in series, is incorporated into the pumping system 16.

The pressure of the chamber is monitored by a capacitance manometer 42 coupled to an inlet tube 74 provided in the flange 26a. An electronic feedback loop 43, controlled by the setting of control unit 101 in response to dial 103, positions the setting of butterfly valve 39 to automatically control the valve setting and hence the chamber pressure. The cold trap 40 is immersed in a −60° C. bath 41 to freeze out any unreacted TiCl$_4$ before it reaches the pump while allowing unreacted SiH$_4$ to be pumped out.

Before making a deposition, a silicon wafer 28 is cleaned using conventional techniques and a 1000Å thermal oxide of Si is grown on it. Flange 26a is removed and the wafer 28 is loaded on the quartz holder 30 where it is suspended so that the bottom surface of the wafer is directly exposed to radiant heater 12. The flange 26a is secured and the chamber 10 is pumped down. Next, heater 70 is turned on to bake out the chamber 10 and to establish the desired polysilicon deposition temperature of about 630° C. Concurrently, the chamber 10 and the bypass line 37 are cyclically purged with nitrogen to obtain a base pressure of less than $10^{-7}$ Torr and thereby to provide an oxygen and moisture free environment.

The gate valve 36 is shut and the pressure of $2 \times 10^{-1}$ Torr at which the polysilicon deposition is to be performed is established by closing the butterfly valve 39 by an appropriate amount while SiH$_4$ is introduced into the chamber from line 56. This is accomplished by dialing in the desired pressure on control unit 101 at the time the silane is introduced into chamber 10. The control unit 101 controls the pressure in the chamber 10 comparing the sensed pressure from manometer 42 and moving the position of butterfly valve 39 in a direction which will bring the pressure to the setting of dial 103.

Thus, a desired layer thickness of polysilicon is deposited on the wafer 28, by flowing SiH4 in the chamber 10 for a given period of time and at the predetermined temperature (about 630° C.) and pressure, i.e., about $2 \times 10^{-1}$ Torr or less.

Next, the chamber pressure (50–460 m Torr) and the wafer temperature (650°–700° C.) are established for the titanium silicide deposition. The cold trap 40 is immersed in a −60° C. bath 41. Then the needle valve 62 is set to let a desired flow of TiCl$_4$ into the chamber.

In situ deposition of polysilicon just prior to the deposition of the titanium silicide film has two advantages, First, a polycide (polysilicon-silicide layered structure) film is obtained which preserves the nearly ideal Metal-Oxide-Semiconductor (MOS) characteristics of the underlying polysilicon; and secondly, the underlying polysilicon film provides a clean interface for the subsequent titanium silicide deposition.

Sequential films of polysilicon and titanium silicide have been deposited, as above, at temperatures ranging from 650° to 700° C. and at pressures of 50 to 460 m Torr and at various ratios of TiCl$_4$/SiH$_4$ flow rates. Some representative results under typical deposition conditions are summarized in Table I below:

TABLE I

Deposition Conditions and Properties of As-Deposited LPCVD Titanium Silicide Films

|  | Film 1 | Film 2[a] | Film 3 | Film 4 | Film 5 |
|---|---|---|---|---|---|
| Pressure (Torr) | 0.5 | 0.063 | 0.15 | 0.65 | 0.46 |
| Silane Flow Rate (sccm) | 20.4 | 20.4 | 21.4 | 21.4 | 21.4 |
| Needle Valve (turns) | 4 | 4 | 4 | ½ | ½ |
| $R_S$ ($\Omega/\square$) | 1 | 4 | 1.1 | 0.25 | 0.38 |
| Thickness (Å) | 2600 | 3800 | 2000 | 15500 | 8400 |
| Resistivity (μΩ-cm) | 26 | 152 | 22 | 39 | 32 |
| Atomic Ratio (Si/Ti) | 2.0 | 1.8 | 2.1 | 1.9 | 2.3 |

[a]Auger detected a high oxygen concentration in this film.

Rutherford Backscattering Spectroscopy was used to determine the Si/Ti ratio and the thickness of these films. Sheet resistances were measured by the four point probe technique. Auger analysis was performed to determine the impurity concentration. A surface profilometer was used to confirm the thicknesses of the titanium silicide and polysilicon films and it also gave a measure of the surface roughness of the silicide films.

Figure 2:
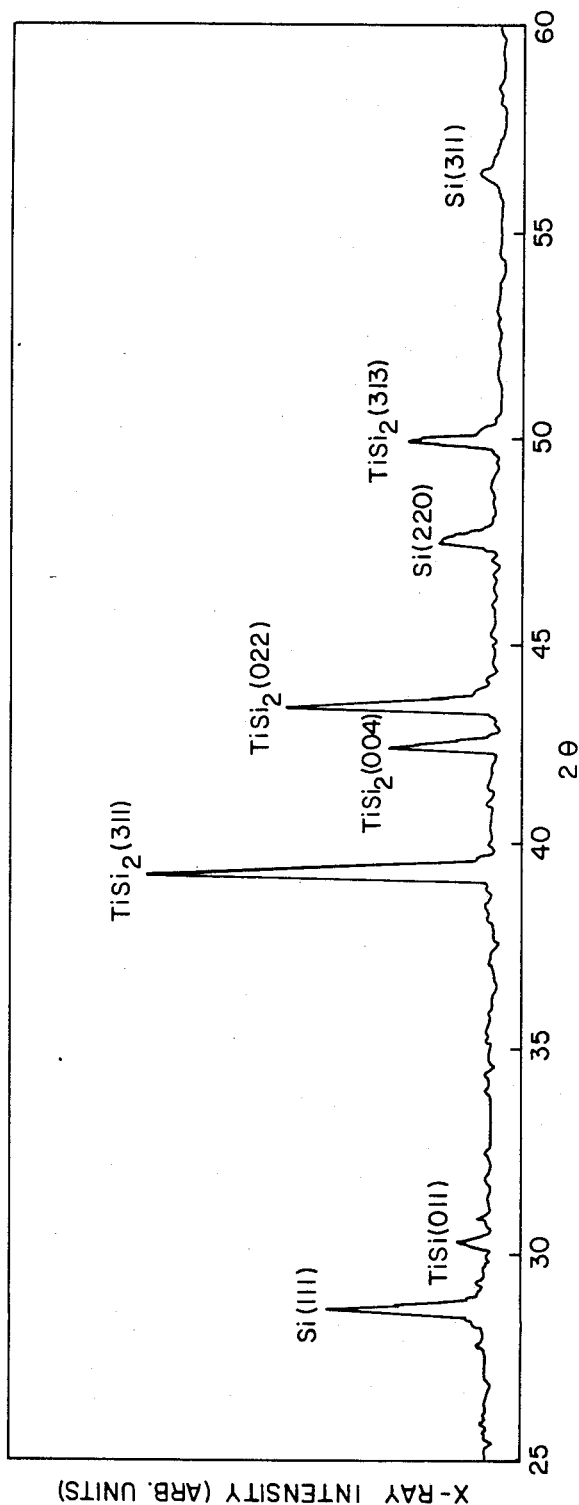
FIG. 2 is an X-ray diffraction spectrum of the Film 4 of Table I.

X-ray diffraction studies of these films show (See FIG. 2) that the as-deposited titanium silicide films are polycrystalline. It is also important to note that in the as-deposited condition, the most stable phase, i.e., TiSi$_2$, is predominant. Thus, no additional processing step, such as annealing, is required after deposition to obtain this stable phase.

The underlying polysilicon peaks can also be identified in this spectrum. Within limits of Auger detection, no impurities, such as oxygen and carbon, were observed except for one film (film #2, table I). A leak in the vacuum system is believed to have caused this oxygen incorporation. It should be noted that the resistivity of this film is very high (150 micro-ohms-cm) due to the presence of oxygen in the silicide film, which points to the importance of having an oxygen free environment during silicide formation.

Sheet resistances of less than 1.1 ohms/square with film thicknesses from 2000 to 15500 Å have been obtained. These correspond to a minimum resistivity of 22 micro ohms-cm to a highest value of approximately 39 micro ohms-cm (excluding film #2, Table I) of the as-deposited silicide films. Even though an ideal Si/Ti ratio of close to 2 was obtained in most of these films, the resistivity variation from film to film is due to the difficulty in measuring the thickness of some of the films accurately. The surface smoothness of the silicide films varied from approximately 50 Å to about 1000 Å in the thickest film (film #4, Table I). The as-deposited films were annealed at 850° C. for 15 minutes in an argon ambient. No changes were observed in the already present titanium silicide phases indicating that the as-deposited films were already in this final stable form.

In summary, the LPCVD reactor of the invention is capable of in-situ sequential deposition of polysilicon and titanium silicide. As-deposited polycrystalline films of titanium silicide with good surface smoothness, low resistivity and uniformity have been obtained in this manner.

Tungsten silicide ($WSi_2$) films can be formed in accordance with the above described process and apparatus by employing tungsten hexafluoride ($WF_6$) as a gaseous reactant source of tungsten in place of titanium tetrachloride ($TiCl_4$). The deposition temperature in this case would be about 450° C. After deposition, annealing of the film in-situ at elevated temperatures for a short period may be desirable to assure that the film will be in the most stable di-silicide phase, i.e., $WSi_2$.

Similarly, tantalum silicide films may be deposited by substituting tantalum pentachloride ($TaCl_5$) as the metal containing reactant and depositing the $TaSi_2$ film at about 625° C. followed by annealing at elevated temperature, as required, to obtain the stable phase. In like manner, molybdenum (Mo) silicide films may be formed.

Equivalents

Those skilled in the art will recognize many equivalents to the specific embodiments described herein. Such equivalents are part of the invention and are intended to be covered by the following claims.

We claim:
1. A method of forming titanium silicide films in-situ over a substrate in a cold walled reactor comprising the step of:
    (a) mounting the substrate on a holder in the reactor;
    (b) bringing the pressure in the reactor to a relatively low pressure;
    (c) purging the reactor containing the substrate with an inert gas while selectively heating the substrate with radiant thermal energy from an incoherent infra-red heater to bring the substrate to a predetermined temperature at which formation of a silicon film from a known reactant will occur on the substrate; while keeping the reactor walls at a substantially lower temperature;
    (d) introducing a gaseous silicon atom containing reactant into the reactor at a suitable temperature and pressure to form a polysilicon layer on the substrate;
    (e) promptly thereafter selectively heating the substrate and polysilicon layer by radiant thermal energy from an incoherent infra-red heater to being the substrate and layer to a predetermined temperature above 500° C. suitable for formation of a titanium silicide layer on said polysilicon layer while maintaining the reactor walls at a substantially lower temperature;
    (f) introducing a gaseous silicon atom containing reactant and a gaseous titanium atom containing reactant into the reactor at a suitable pressure to form a layer of titanium silicide on said layer; said titanium silicide layer, as deposited, being smooth and having a minimum resistivity of 22 microohms-cm to a value of approximately 39 microohms-cm.
2. The method of claim 1 wherein the titanium atom containing reactant in step (f) is $TiCl_4$ and a layer of stable phase $TiSi_2$ is formed.
3. The method of claim 2 wherein the temperatur in step (e) is in the range between above 500° C. to about 700° C.
4. The method of claim 3 wherein the pressure in step (f) is in a range between about 50–460 m Torr.
5. The method of claim 4 wherein the atomic ratio of Si to Ti atoms in the reactants in step (f) is between about 1.5 to 2.5.
6. The method of claim 1 wherein the titanium atom containing reactant in step (f) is $TiCl_4$ and a layer of stable phase polycrystalline $TiSi_2$ is formed without annealing and the heater in step (c) is an intra-red lamp.

* * * * *

UNITED STATES PATENT AND TRADEMARK OFFICE
CERTIFICATE OF CORRECTION

PATENT NO. : 4,668,530
DATED : May 26, 1987
INVENTOR(S) : L. Rafael Reif, Prabha K. Tedrow and Vida Ilderem It is certified that error appears in the above—identified patent and that said Letters Patent is hereby corrected as shown below:

Claim 1, part (e), change "being" to ---bring---.

Claim 3, line 1, change "temperatur" to ---temperature---.

Signed and Sealed this

Eighteenth Day of August, 1987

*Attest:*

DONALD J. QUIGG

*Attesting Officer*     *Commissioner of Patents and Trademarks*